United States Patent
Ikeya et al.

[19]

[11] Patent Number: 6,132,167

[45] Date of Patent: Oct. 17, 2000

[54] ELECTRONIC COMPONENT FEEDING APPARATUS

[75] Inventors: Keishi Ikeya; Makoto Sueki; Hideki Uchida; Kazuhiko Narikiyo, all of Kofu, Japan

[73] Assignee: Matsushita Electronic Industrial Co., Ltd., Osaka-fu, Japan

[21] Appl. No.: 09/029,102

[22] PCT Filed: Jun. 26, 1997

[86] PCT No.: PCT/JP97/02168

§ 371 Date: Feb. 20, 1998

§ 102(e) Date: Feb. 20, 1998

[87] PCT Pub. No.: WO97/50284

PCT Pub. Date: Dec. 31, 1997

[30] Foreign Application Priority Data

Jun. 24, 1996 [JP] Japan ...................................... 8-163180

[51] Int. Cl.[7] .................................................. H05K 13/02
[52] U.S. Cl. .......................................... 414/798.9; 29/809
[58] Field of Search ...................................... 414/403, 413, 414/416, 782, 798.9, 801, 810, 811; 29/741, 809

[56] References Cited

U.S. PATENT DOCUMENTS 4,599,026  7/1986  Feiber et al. ......................... 29/809 X
4,733,459  3/1988  Tateno ................................. 29/741

FOREIGN PATENT DOCUMENTS 5986297   5/1984   Japan .
60-197518 10/1985  Japan ..................... 414/413
4223400   8/1992   Japan .
5198969   8/1993   Japan .
652193    7/1994   Japan .

*Primary Examiner*—Janice L. Krizek
*Attorney, Agent, or Firm*—Price, Gess & Ubell

[57] ABSTRACT

A method of and apparatus for feeding electronic components are provided in which a group of electronic components joined to each other and stored in a stick are separated from each other before being supplied, regardless of the configuration at the joining ends of the electronic components as well as the presence of burrs developed during a molding process of the electronic components. In particular, a separating unit (6) comprises a step (20) which is dropped in level at the front end of a tilted chute (4) for receiving the forefront electronic component (2) and an arm (22) for holding down the succeeding electronic component (2) from above and causing the same to move backward along the tilted chute (4).

17 Claims, 4 Drawing Sheets

ELECTRONIC COMPONENT FEEDING APPARATUS

TECHNICAL FIELD

The present invention relates to an electronic component feeding apparatus for feeding electronic components one by one which are stored in sticks in an automatic mounting operation of electronic components.

BACKGROUND ART

One of the methods for feeding electronic components is called a stick supply. Such a conventional method and its apparatus is explained referring to the drawings.

As shown in FIG. 2, the common electronic component feeding apparatus of such a type comprises a holder 3 for holding a group of sticks 1, each stick storing a row of electronic components, a tilted chute 4 having a separating means 6 at the front end thereof for separating the forefront electronic component 2 from another, and a swinging means 7 for holding and moving the forefront electronic component 2 to a horizontal position 35.

The separating means 6 may, for example, comprise a pivotal block 41 having a separating pin 42 and being arranged movable about a pivot 40 located at the front end of the tilted chute 4, and a shutter 14 which opens and closes, as shown in FIG. 4. In action, the electronic components 2 joined to one another are downwardly released from the stick 1 and guided by the tilted chute 4 to slide down to the front end of the chute 4 due to its own weight. The separating means 6 rotates the pivotal block 41 to cause the separating pin 42 to be inserted between the forefront and the succeeding electronic components 2 to separate them. The shutter 14 at the front end of the tilted chute 4 is then opened to transfer only the separated electronic component 2 to the swinging means 7.

It happens sometimes, however, that the separating pin 42 fails to be inserted between the two adjacent electronic components 2 depending on configuration of the interface between the components. Thus, another example of the separating means 6 which has been employed includes a stopper 45 which holds the second electronic component 2 from above while permitting the first one to run through the opened shutter 14 at the front end of the tilted chute 4 to the swinging means 7, as shown in FIG. 5.

However, the above-described arrangement has such a drawback as described below. When each electronic component 2 has a burr at its joining ends produced in the forming process, the forefront electronic component is prevented from being separated due to its burr 12 being held by a burr 13 of the following electronic component 2 which is pressed and stopped by the stopper 45 from above.

It is an object of the present invention to provide an electronic component feeding apparatus being capable of separating electronic components from one another which are joined to each other and stored in sticks, and supplying the electronic components one by one regardless of the configuration at joining ends of the electronic components as well as the presence of burrs at the joining ends developed during a molding process of the electronic components.

DISCLOSURE OF THE INVENTION

To accomplish the above said object, the electronic component feeding apparatus according to the present invention has a holder for holding sticks, each stick storing a plurality of electronic components joined to each other, a tilted chute mounted to be sloped for allowing the electronic components to run down from the stick and provided with a separating means at a front end thereof for separating a forefront electronic component from the others, and a swinging means for holding and moving the forefront electronic component to a horizontal position, and is characterized in that the separating means comprises a step which is dropped in level at a front end of the tilted chute for receiving the forefront electronic component and an arm for holding down the succeeding electronic component from above and for moving the same backward along the tilted chute.

Even if the electronic components have burrs at their either end developed in a process of molding and are slid down along the tilted chute with a burr of the succeeding electronic component overlapping a burr of the foregoing electronic component, the two burrs are easily separated because the forefront electronic component is brought to a position lower than the succeeding electronic component at the step on the tilted chute, whereby the burrs between the adjacent electronic components are disengaged, separating the forefront electronic component. If the burr of the leading electronic component overlaps the burr of the succeeding electronic component when they are sliding down on the tilted chute, the succeeding electronic component is held down from above and forcibly moved backward on the tilted chute. This causes the leading electronic component to be caught by a step wall of the step and thus separated with ease. Also, the present invention can be implemented by a conventional electronic component feeding apparatus with a stick feeder which is simply modified with its tilted chute having a step and its separating means having a sliding mechanism.

BEST MODES FOR CARRYING OUT THE INVENTION

One embodiment of the present invention will be described referring to the accompanying drawings.

Figure 1:
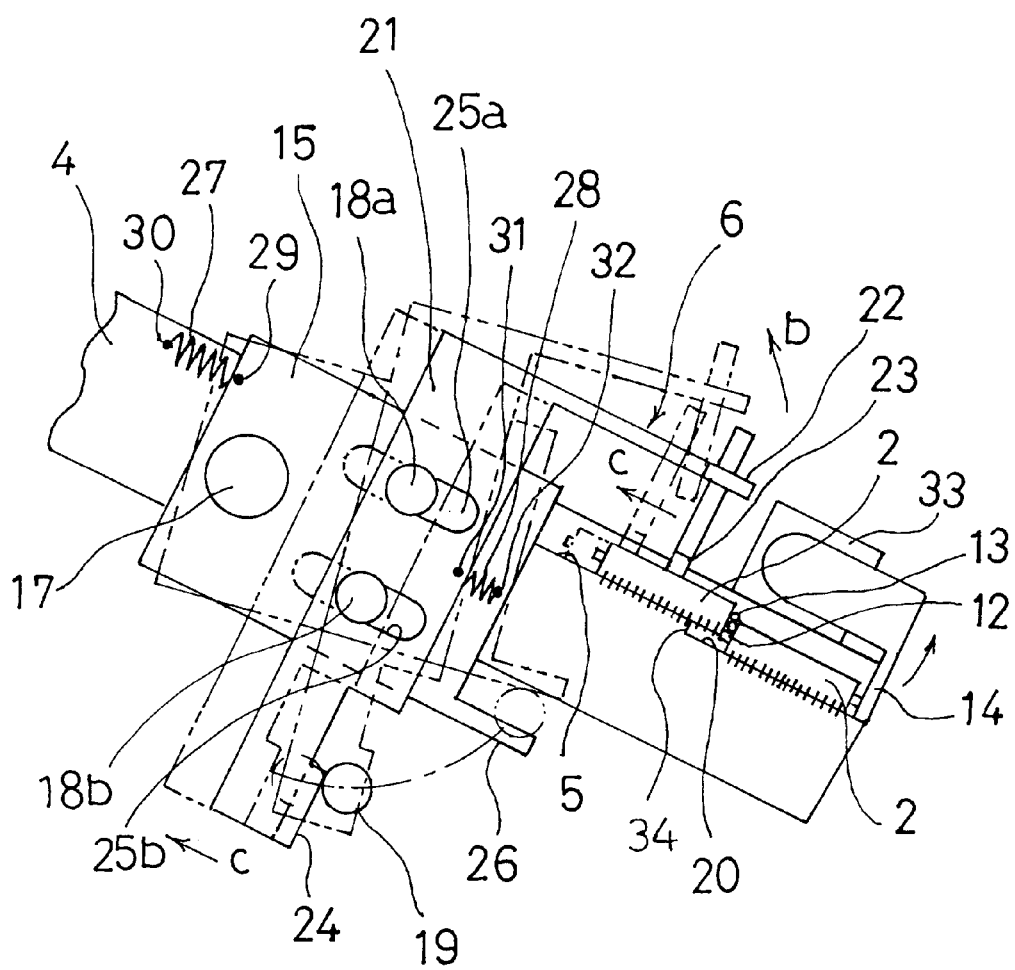
FIG. 1 is a side view of a separating means according to one embodiment of the present invention.
Figure 2:
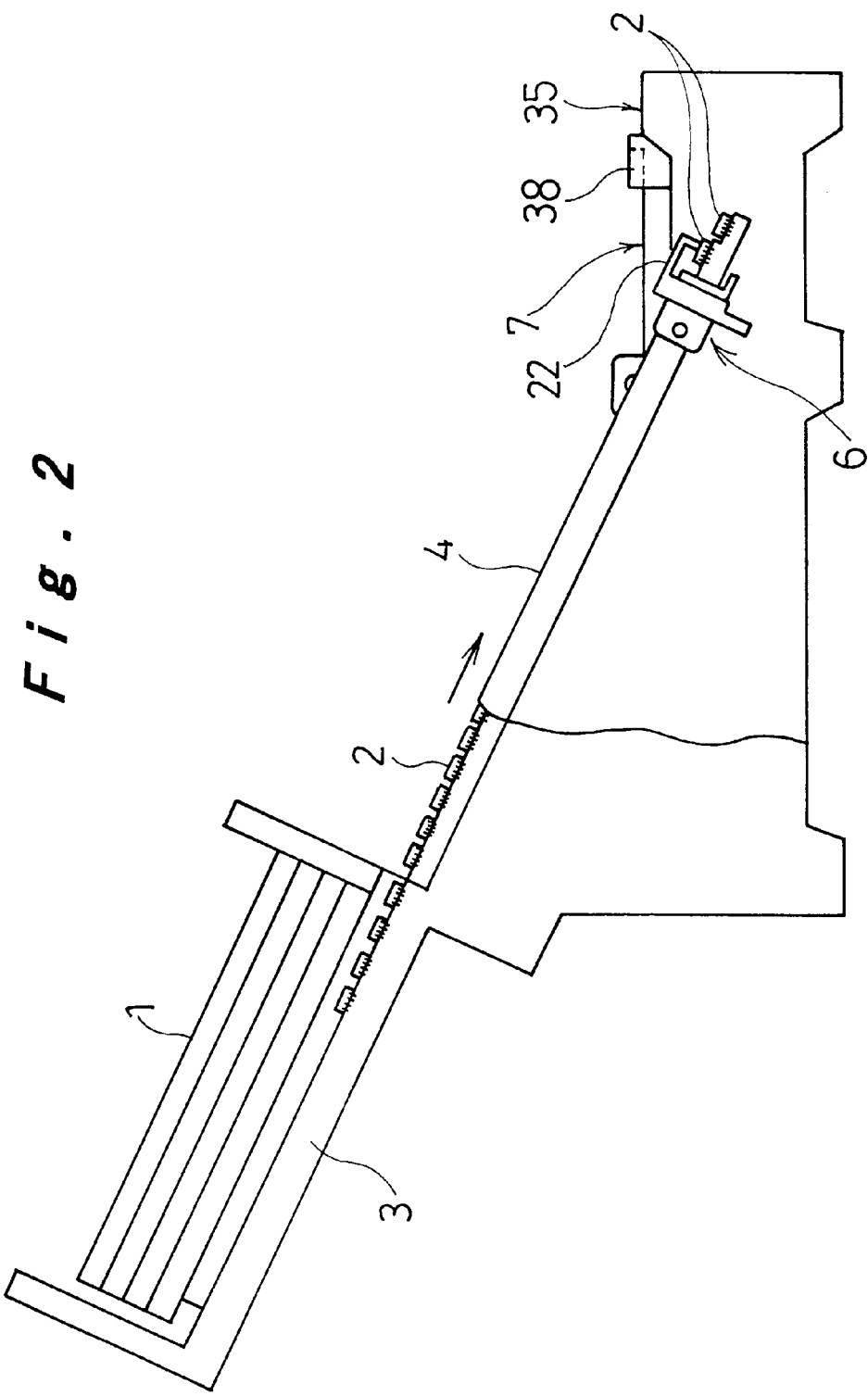
FIG. 2 is a schematic view showing the overall arrangement of an electronic component feeding apparatus of the present invention.
Figure 3:
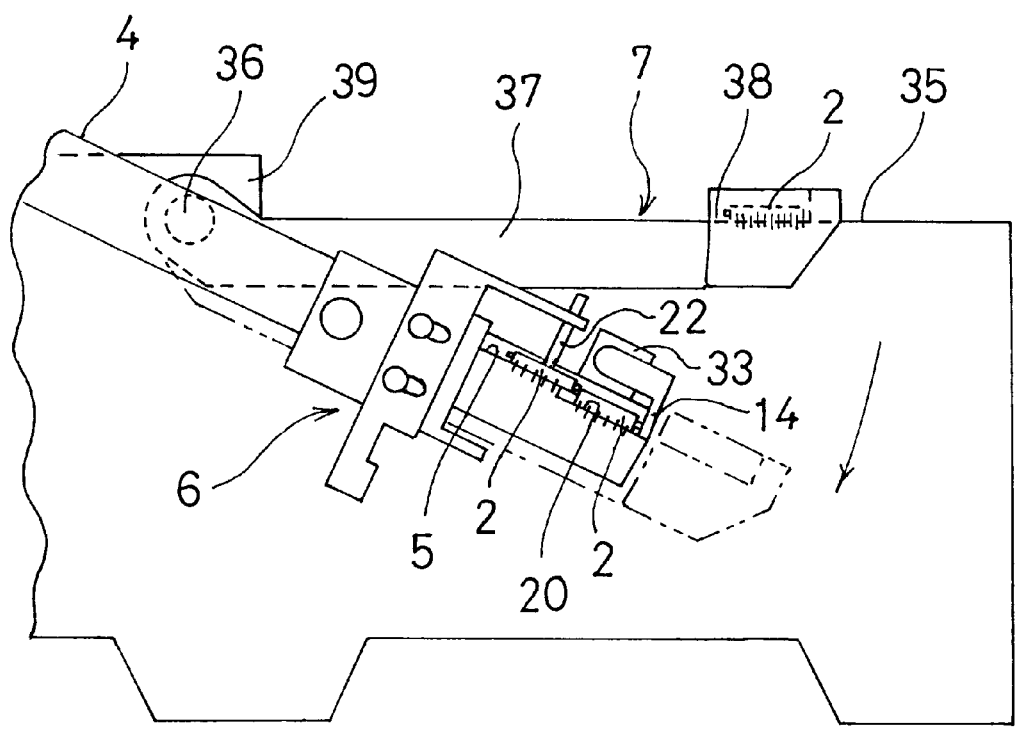
FIG. 3 is a side view of a swinging means according to one embodiment of the present invention.
Figure 4:
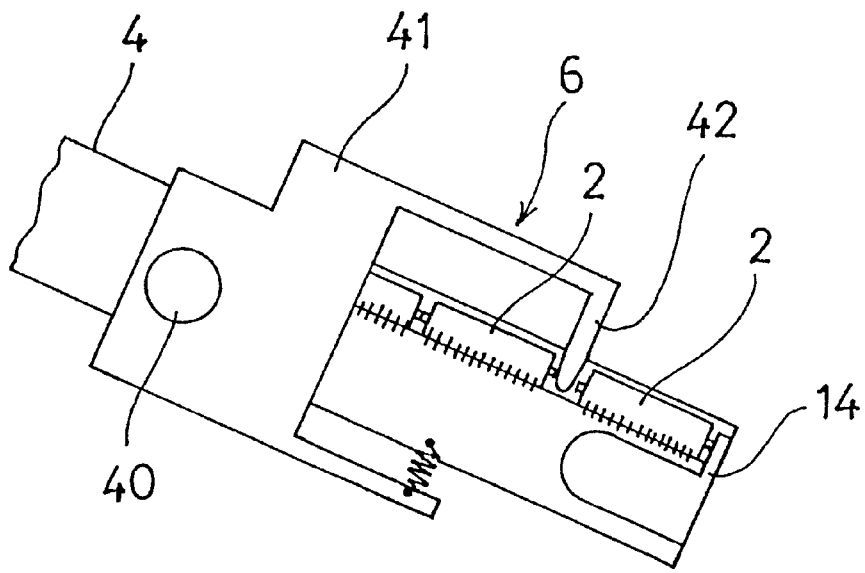
FIG. 4 is a side view of a conventional separating means.
Figure 5:
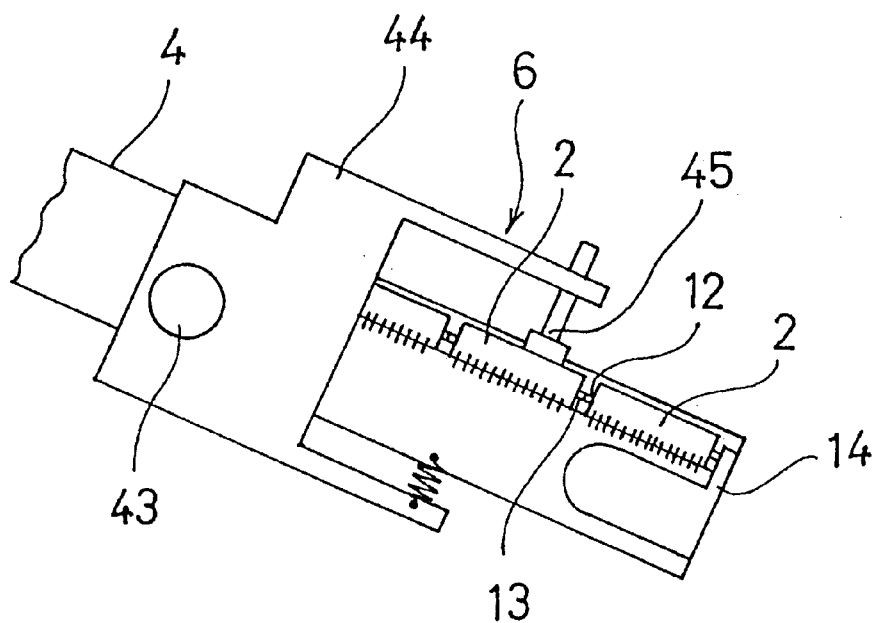
FIG. 5 is a side view of another conventional separating means.

An electronic component feeding apparatus of the present invention comprises, as shown in FIGS. 1 to 3, a holder 3 for holding a group of sticks 1, each stick storing a row of electronic components 2, a tilted chute 4 given a slope allowing the electronic components 2 to slide down from the stick 1 on a first support surface and having a separating means 6 at its front end 5 for separating the forefront electronic component 2 at the head from the remaining components and a swinging means 7 for holding and moving the forefront electronic component 2 to a horizontal feeding location 35.

The separating means 6 comprises, as best shown in FIG. 1, a step 20 located at the front end 5 of the chute 4, a shutter 14 provided at the front end of the step 20 and driven by an opening/closing means 33 to open and close for letting the forefront electronic component 2 to slide down toward the swinging means 7, a pivotal block 15 supported about a pivot 17 located on the front end 5 of the chute 4 for turning movement in the direction of b, a slide block 21 supported by a pair of guide pins 18*a* and 18*b* on the pivotal block 15 for sliding movement along the direction c, a drive pin 19 mounted to actuate the turning movement of the pivotal block 15 and the sliding movement of the slide block 21, and a drive unit (not shown) for driving the drive pin 19 linking with the action of the shutter 14.

The step 20 disposed at the front end 5 of the chute 4 is a tilted portion which is dropped in level, and has a second support surface of a length slightly greater than that of the electronic component 2. Its level is lowered from the front end 5 of the chute 4 to have a depth being substantially one half of the height of the electronic component 2, so that it can accept only one electronic component at a time.

The pivotal block 15 includes a hole in which the pivot 17 is supportingly fitted, a pivotal operating part 26 for direct contact with the drive pin 19, the pair of upper and lower guide pins 18*a* and 18*b* supporting the slide block 21 in such a way that the slide block 21 can reciprocate only along the direction of c which is parallel to a straight line across the pivot 17 but is inhibited to pivot with respect to the pivotal block 15, and a spring 27 fixedly mounted at one end to an anchor portion 29 of the pivotal block 15 and at the other end to an anchor portion 30 of the tilted chute 4 for restoring the rotated pivotal block 15.

The slide block 21 comprises an arm holding member 22 for holding down the upper side of the succeeding electronic component 2 through a friction member 23, a slider operating part 24 for direct contact with the drive pin 19, a pair of upper and lower guide holes 25*a* and 25*b* for respectively receiving the pair of guide pins 18*a* and 18*b* so that the slide block 21 can reciprocate along the direction of c which is parallel to the straight line across the pivot 17, and a spring 28 fixedly mounted at one end to an anchor portion 31 of the slide block 21 and at the other end to an anchor portion 32 of the pivotal block 15 for restoring the slide block 21 to its initial position.

The swinging means 7 comprises, as best shown in FIG. 3, a swing arm 37 mounted for pivotal movement about a pivot 36 located near the front end 5 of the tilted chute 4, a component holder 38 mounted to the distal end of the swing arm 37 for forward and backward movements between an extension of the step 20 and a horizontal feeding position 35 when receiving the electronic component 2, and a drive unit 39 for driving the swing arm 37 linking with the opening and closing action of the shutter 14.

A procedure of feeding the electronic components in the electronic component feeding apparatus of the present invention will be hereinafter explained.

First, the drive pin 19 pushes the pivotal operating part 26 of the pivotal block 15 against the yielding force of the spring 27 to lift up the arm 22, which allows the electronic components 2 joined one another to slide downwardly to the front end 5 of the tilted chute 4, and the forefront electronic component 2 is guided into the step 20. When the drive pin 19 is detached from the pivotal operating part 26, the arm 22 is actuated by the restoring force of the spring 27 to hold down the succeeding electronic component 2 with the friction member 23 at its distal end. As the drive pin 19 is further moved to push the slider operating part 24 of the slide block 21, only the slide block 21 is parallelly slid in the direction of c while both the blocks 15 and 21 are restrained to maintain their orientation, since the succeeding electronic component 2 is held down by the arm 22 of the slide block 21 which is fixedly supported with the pivotal block 15. Accordingly, the succeeding electronic component 2 is moved back in the direction of c along the tilted chute 4.

Even if the forefront electronic component 2 is slid down with the succeeding electronic component 2 having the burr 13 at its front end overlapping the burr 12 at the rear end of the forefront electronic component 2, the forefront electronic component 2 is led into the step 20 by being dropped in level, thus causing the burrs 12 and 13 to be disengaged, or the forefront electronic component 2 is caught by a step wall 34 and kept to be in the step 20, causing the succeeding electronic component 2 to be separated therefrom. Also, in case that the burr 12 at the rear end of the forefront electronic component 2 overlaps the burr 13 at the leading end of the succeeding electronic component 2, the forefront electronic component 2 is tilted by its own weight and caught by the step wall 34, thus being separated from the succeeding electronic component 2.

This is followed by opening the shutter 14 at the front end of the step 20 while the succeeding electronic component 2 is held with the arm 22, so as to allow the forefront electronic component 2 to slide down to the swinging means 7. At this time, the component holder 38 of the swinging means 7 is lifted down by the action of the drive unit 39 to locate at the extension of the step 20 for receiving and holding the forefront electronic component 2 released through the shutter 14 which is opened at the same time. The drive unit 39 lifts up the component holder 38 to the horizontal feeding position 35 for feeding the forefront electronic component 2 to the horizontal feeding position 35. By repeating the above described procedures, a row of electronic components 2 are separated one from another and placed horizontally before being conveyed to the next steps of mounting operation (not shown).

INDUSTRIAL APPLICABILITY

The electronic components feeding apparatus of the present invention permits a number of electronic components to be separated from each other and fed one by one regardless of the configuration at the joining ends of the electronic components as well as the presence of burrs developed during a molding process of the electronic components, and is thus favorably applied to the implementation of a stick supply in automatic mounting operation of the electronic components.

What is claimed is:

1. An electronic component feeding apparatus having a holder (3) for holding sticks (1), each stick storing a plurality of electronic components (2, 2) joined to each other, a tilted chute (4) mounted to be sloped for allowing the electronic components (2, 2) to move down from the stick (1) and provided with a separating means (6) at a front end thereof for separating a forefront electronic component (2) from the others, and a swinging means (7) for holding and moving the forefront electronic component (2) to a horizontal position (35), characterized in that the separating means (6) comprises a step (20) which is dropped in level at a front end of the tilted chute (4) for receiving the forefront electronic component (2) and an arm (22) for holding down the succeeding electronic component (2) from above and for moving the same backwardly along the tilted chute (4).

2. In an automatic feeding apparatus for sequentially joined components, the improvement of a separating apparatus for removing a forefront component from the remaining components, comprising:

a first support surface for supporting a predetermined number of joined components; and a separating apparatus connected to the first support surface including a second support surface spaced at a predetermined distance below the first support surface to provide a step between the first and second support surface, a holding member for contacting and moving the joined components on the first support surface when a forefront component has been positioned on the second support surface and means for moving the holding member in a direction along the first support surface away from the second support surface to ensure a separation of the forefront component.

3. The invention of claim 2 further including a shutter member for holding the forefront component after separation.

4. The invention of claim 3 further including a swinging means to remove the forefront component after it leaves the second support surface.

5. The invention of claim 2 wherein the second support surface has a length slightly greater than a component length.

6. The invention of claim 2 wherein a height of the step between the first and second support surfaces is substantially one-half of a height of the components.

7. The invention of claim 2 wherein the means for moving the holding member includes a slide block and a pair of guide pins supporting the slide block.

8. The invention of claim 7 wherein the holding member is cantilevered from the slide block and the slide block is mounted for rotation of the holding member towards and away from the components.

9. The invention of claim 2 wherein the holding member is moved sufficiently along the first support surface to enable the forefront component to contact the step if it is still connected to the remaining components.

10. A method of releasing an electronic component from a series of joined electronic components supported on a first support surface to permit a forefront electronic component to be positioned on a second support surface separated from the first support surface by a step to enable a subsequent mounting operation, comprising the steps of:

advancing the series of joined electronic components on the first support surface towards the second support surface so that the forefront electronic component is positioned on the second support surface; and retracting the series of joined electronic components along the first support surface from the second support surface by a predetermined distance that will ensure that the forefront electronic component will contact the step and be released from the joined electronic components.

11. In an automatic feeding apparatus for sequentially joined components, the improvement of a separating apparatus for removing a forefront component from the remaining components, comprising:

a first support surface for supporting a predetermined number of joined components for movement along the first support surface in a first direction; and a separating apparatus connected to the first support surface including a second support surface spaced at a predetermined distance below the first support surface to provide a step between the first and second support surface, a holding member for contacting and moving the joined components on the first support surface when a forefront component has been positioned on the second support surface and a reciprocation assembly for moving the holding member in an opposite direction to the first direction along the first support surface away from the second support surface to ensure a separation of the forefront component by contact with the step.

12. The invention of claim 11 further including a shutter member for holding the forefront component after separation.

13. The invention of claim 12 further including a swinging arm to remove the forefront component after it leaves the second support surface and to position the forefront component in a horizontal position.

14. The invention of claim 12 wherein the second support surface has a length slightly greater than a component length.

15. The invention of claim 12 wherein a height of the step between the first and second support surfaces is substantially one-half of a height of the components.

16. The invention of claim 11 wherein the reciprocation assembly for moving the holding member includes a slide block and a pair of guide pins supporting the slide block.

17. The invention of claim 16 wherein the holding member is cantilevered from the slide block and the slide block is mounted for rotation of the holding member towards and away from the components.

* * * * *